US009536965B2

(12) United States Patent
Pei et al.

(10) Patent No.: US 9,536,965 B2
(45) Date of Patent: Jan. 3, 2017

(54) HEAT SPREADER ON GAN SEMICONDUCTOR DEVICE

(71) Applicant: Dynax Semiconductor, Inc., Kunshan (CN)

(72) Inventors: Yi Pei, Kunshan (CN); Mengjie Zhou, Kunshan (CN); Naiqian Zhang, Kunshan (CN)

(73) Assignee: DYNAX SEMICONDUCTOR, INC., Kunshan (CN)

( * ) Notice: Subject to any disclaimer, the term of this patent is extended or adjusted under 35 U.S.C. 154(b) by 0 days.

(21) Appl. No.: 14/922,017

(22) Filed: Oct. 23, 2015

(65) Prior Publication Data

US 2016/0118460 A1  Apr. 28, 2016

(30) Foreign Application Priority Data

Oct. 24, 2014 (CN) .......................... 2014 1 0577484

(51) Int. Cl.
*H01L 29/417* (2006.01)
*H01L 29/47* (2006.01)
(Continued)

(52) U.S. Cl.
CPC ..... *H01L 29/41758* (2013.01); *H01L 29/0673* (2013.01); *H01L 29/0847* (2013.01);
(Continued)

(58) Field of Classification Search
None
See application file for complete search history.

(56) References Cited

U.S. PATENT DOCUMENTS

2011/0221011 A1\* 9/2011 Bahat-Treidel ....... H01L 29/404
257/409
2013/0122669 A1\* 5/2013 Koyama ........... H01L 29/66045
438/167

(Continued)

OTHER PUBLICATIONS

Definition of 'Interdigital' downloaded from URL<http://www.merriam-webster.com/medical/interdigital> on Apr. 21, 2016.*

(Continued)

*Primary Examiner* — Joseph Schoenholtz
(74) *Attorney, Agent, or Firm* — Fleiner IP Law, LLC; Zareefa Burki Flener

(57) ABSTRACT

A semiconductor device comprises: a substrate; a multilayer semiconductor layer located on the substrate; a source located on the multilayer semiconductor layer, the source including a first source portion inside an active region and a second source portion inside a passive region; a drain located on the multilayer semiconductor layer, the drain including a first drain portion inside the active region and a second drain region inside the passive region; a gate located on the multilayer semiconductor layer, the gate including a first gate portion inside the active region and a second gate portion inside the passive region, and the first gate portion being in a form of interdigital among the first source portion and the first drain portion; and a heat dissipating layer disposed at one or more of the first source portion, the first drain portion, the first gate portion, the second source portion, the second drain portion and the second gate portion.

20 Claims, 5 Drawing Sheets

(51) Int. Cl.
| | |
|---|---|
| *H01L 29/778* | (2006.01) |
| *H01L 29/16* | (2006.01) |
| *H01L 29/45* | (2006.01) |
| *H01L 29/40* | (2006.01) |
| *H01L 29/08* | (2006.01) |
| *H01L 29/20* | (2006.01) |
| *H01L 29/06* | (2006.01) |
| *H01L 29/41* | (2006.01) |
| *H01L 23/373* | (2006.01) |

(52) U.S. Cl.
CPC .......... *H01L 29/1606* (2013.01); *H01L 29/20* (2013.01); *H01L 29/401* (2013.01); *H01L 29/452* (2013.01); *H01L 29/475* (2013.01); *H01L 29/7786* (2013.01); *H01L 29/7787* (2013.01); *H01L 23/373* (2013.01); *H01L 23/3736* (2013.01); *H01L 29/2003* (2013.01); *H01L 29/413* (2013.01); *H01L 29/4175* (2013.01); *H01L 2924/13064* (2013.01)

(56) References Cited

U.S. PATENT DOCUMENTS

| | | | | |
|---|---|---|---|---|
| 2014/0103360 A1* | 4/2014 | Hikita | ............... | H01L 29/66212 257/76 |
| 2014/0159118 A1* | 6/2014 | Lenci | ............... | H01L 21/28247 257/194 |
| 2015/0069408 A1* | 3/2015 | Nanjo | ............... | H01L 29/7787 257/76 |
| 2015/0179782 A1* | 6/2015 | Yamamura | ............ | H01L 29/205 257/76 |
| 2015/0270382 A1* | 9/2015 | Khan | ............... | H01L 29/66484 257/194 |

OTHER PUBLICATIONS

Definition of 'Adjective' downloaded from URL <http://www.merriam-webster.com/dictionary/adjective> on Apr. 21, 2016.*

Definition of 'Interdigital' downloaded form URL http://www.oxforddictionaries.com/us/definition/american_english/interdigital> on Apr. 21, 2016.*

Yan, Z., et. al., "Review of Thermal Properties of Graphene and Few-Layer Graphene: Applications in Electronics", IET Circuits Devices and Systems, vol. 9Issue 1, pp. 4-12 Jan. 2015.*

Z. Yan, G. Liu, J. M. Khan, and A. A. Balandin: 'Graphene quilts for thermal management of high-power GaN transistors', Nat Commun, 2012, vol. 3, p. 827.*

University of California—Riverside. "Technique keeps cool high-power semiconductor devices used in wireless applications, traffic lights and electric cars." ScienceDaily. ScienceDaily, May 8, 2012. downloaded from URL<www.sciencedaily.com/releases/2012/05/120508152133.htm> on Apr. 21, 2016.*

* cited by examiner

HEAT SPREADER ON GAN SEMICONDUCTOR DEVICE

CROSS-REFERENCE TO RELATED APPLICATIONS

The present application claims priority under 35 U.S.C. §119 to Chinese Patent Application No. 201410577484.6, filed on Oct. 24, 2014, in the State Intellectual Property Office of China, and entitled "Semiconductor Device", which is incorporated by reference herein in its entirety.

TECHNICAL FIELD

Aspects of the present disclosure relate to a semiconductor device.

BACKGROUND

Compared with the first-generation semiconductor of silicon and the second-generation semiconductor of GaAs, GaN semiconductor devices have many outstanding advantages such as large band gap, high electron saturation velocity, high breakdown voltage and ability to withstand high temperatures, which makes it more suitable for electronic devices operated under high temperature, high pressure, high frequency and high power. Thus GaN semiconductor devices have broad application prospects.

Since the GaN semiconductor devices are operated at the environment with high power and high current, a relatively large amount of heat is generated by the GaN semiconductor devices. Some performances of the GaN semiconductor devices are greatly influenced by temperature, for example, Schottky contact and carrier mobility, etc. If a local high temperature is generated within a Schottky contact region, the Schottky contact will be degraded, causing reduction of barrier height and increase of gate leakage current. In a severe case, the GaN semiconductor device will become failure. Even if there is no change of Schottky barrier at high temperatures, the energy of carriers in the GaN semiconductor device will increase as the temperature rises. In this case, the carriers are more likely to cross the barrier layer, thereby causing the increase of the gate leakage current. In addition, as the temperature rises, the phonon scattering suffered by Two-Dimensional Electron Gas (2DEG) in the channels increases, so the mobility of 2DEG rapidly decreases, causing a rapid decrease of the output current of the device. Therefore, the output power of the device is affected, thereby causing degradation of RF performance and microwave performance of the device. Thus it could be seen that effective heat dissipation has a significant impact on the reliability and performance of GaN semiconductor devices.

Currently, the GaN semiconductor devices dissipate heat in the following three ways: a part of the heat produced by the GaN semiconductor device is longitudinally transferred to a base of good thermal conductivity via a substrate; a part of the heat is laterally transferred to a passive region which is located outside an active region via metal electrode wires and semiconductor material inside the GaN semiconductor device; and a remaining part of the heat is dissipated through air above a top surface of the GaN semiconductor device. However, the cooling effect still needs to be increased in the art to further increase reliability and performance of the semiconductor devices.

SUMMARY

Embodiments of the present invention are directed to a semiconductor device with improved reliability and performance.

According to an embodiment of the present invention, a semiconductor device comprises: a substrate; a multilayer semiconductor layer located on the substrate, the multilayer semiconductor layer including an active region and a passive region located outside the active region; a source located on the multilayer semiconductor layer, the source including a first source portion inside the active region and a second source portion inside the passive region; a drain located on the multilayer semiconductor layer, the drain including a first drain portion inside the active region and a second drain region inside the passive region; a gate located on the multilayer semiconductor layer, the gate including a first gate portion inside the active region and a second gate portion inside the passive region, and the first gate portion being in a form of interdigital among the first source portion and the first drain portion; and a heat dissipating layer disposed at one or more of the first source portion, the first drain portion, the first gate portion, the second source portion, the second drain portion and the second gate portion.

The heat dissipating layer may comprise a first heat dissipating layer disposed on the first gate portion and a second heat dissipating layer disposed on one or more of the first source portion, the first drain portion, the second source portion, the second drain portion and the second gate portion.

The semiconductor device may further comprise: a first dielectric layer disposed on the multilayer semiconductor layer between the first source portion and the first gate portion and between the first drain portion and the first gate portion; and a second dielectric layer disposed on the first heat dissipating layer and on the first dielectric layer between the first source portion and the first gate portion and between the first drain portion and the first gate portion.

The semiconductor device may further comprise a third dielectric layer disposed on the second heat dissipating layer and the second dielectric layer.

The second heat dissipating layer may comprise a part inside the passive region. A window may be disposed as penetrating through the part inside the passive region of the second heat dissipating layer and the third dielectric layer on the part inside the passive region of the second heat dissipating layer.

The second source portion may be coupled to the first source portion via an air bridge, the second heat dissipating layer may be further disposed on the air bridge.

The second drain portion may be coupled to the first drain portion via a drain interconnection metal, the second heat dissipating layer may be further disposed on the drain interconnection metal.

The semiconductor device may further comprise a heat sink which is disposed at edges of the passive region and is connected to the second heat dissipating layer. The heat sink may be made of ceramic.

The heat dissipating layer may comprise a third heat dissipating layer disposed on the first gate portion and a fourth heat dissipating layer disposed in one or more of the first source portion, the first drain portion, the second source portion, the second drain portion and the second gate portion.

The semiconductor device may further comprise: a first dielectric layer disposed on the multilayer semiconductor layer between the first source portion and the first gate portion, between the first drain portion and the first gate portion, between the second source portion and the second gate portion and between the second drain portion and the second gate portion; and a fourth dielectric layer disposed on the third heat dissipating layer and on the first dielectric layer between the first source portion and the first gate portion, between the first drain portion and the first gate portion, between the second source portion and the second gate portion and between the second drain portion and the second gate portion.

The semiconductor device may further comprise: a back metal located on a surface of the substrate opposite to the multilayer semiconductor layer; and a backside via below one of the first source portion and the second source portion, the backside via penetrating through the multilayer semiconductor layer and the substrate and being coupled to the back metal. The heat dissipating layer may comprise a fifth heat dissipating layer disposed in the backside via.

The semiconductor device may further comprise: a first dielectric layer disposed on the multilayer semiconductor layer between the first source portion and the first gate portion, between the first drain portion and the first gate portion, between the second source portion and the second gate portion and between the second drain portion and the second gate portion; and a fifth dielectric layer disposed on the first gate portion and on the first dielectric layer between the first source portion and the first gate portion, between the first drain portion and the first gate portion, between the second source portion and the second gate portion and between the second drain portion and the second gate portion.

The semiconductor device may further comprise a metal layer disposed on an inner surface of the backside via and the fifth heat dissipating layer may be disposed on the metal layer. The metal layer may be made of the same material as that of the back metal. The metal layer may be connected to the back metal at an end of the backside via near the back metal.

The backside via may have a cross-sectional shape of a circle or an oval.

The heat dissipating layer may be made of a material selected from the group consisting of single layer graphene, bilayer graphene, multilayer graphene, graphene nanosheets, single-walled carbon nanotube and multi-walled carbon nanotube or combination thereof.

The multilayer semiconductor layer may comprise: a nucleation layer located on the substrate; a buffer layer located on the nucleation layer; a barrier layer located on the buffer layer, the barrier layer and the buffer layer forming a heterojunction structure, two-dimensional electron gas being formed at an interface of the heterojunction; and a capping layer located on the barrier layer. The first source portion, the first drain portion, the first gate portion, the second source portion, the second drain portion and the second gate portion may be located on the capping layer.

By disposing a heat dissipating layer at one or more of the first source portion, the first drain portion, the first gate portion, the second source portion, the second drain portion and the second gate portion, the thermal conductivity in the lateral direction is improved. Therefore, the heat dissipating effect of the whole semiconductor device is improved, the temperature inside the semiconductor device is reduced, and thus the reliability and performance of the semiconductor device is improved.

BRIEF DESCRIPTION OF DRAWINGS

These and/or other aspects will become apparent and more readily appreciated from the following description of the embodiments, taken in conjunction with the accompanying drawings in which.

DETAILED DESCRIPTION

Figure 1:
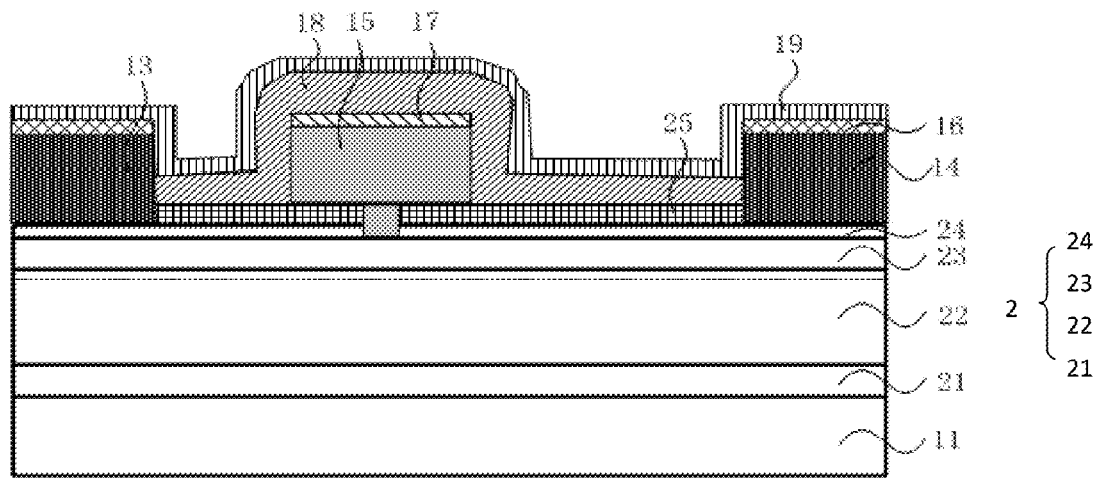
FIG. 1 shows a schematic cross-sectional view of a semiconductor device according to a first embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

In addition, when an element is referred to as being "on" another element, it can be directly on the other element or be indirectly on the other element with one or more intervening elements interposed therebetween. Also, when an element is referred to as being "connected to" another element, it can be directly connected to the other element or be indirectly connected to the other element with one or more intervening elements interposed therebetween.

Figure 2:
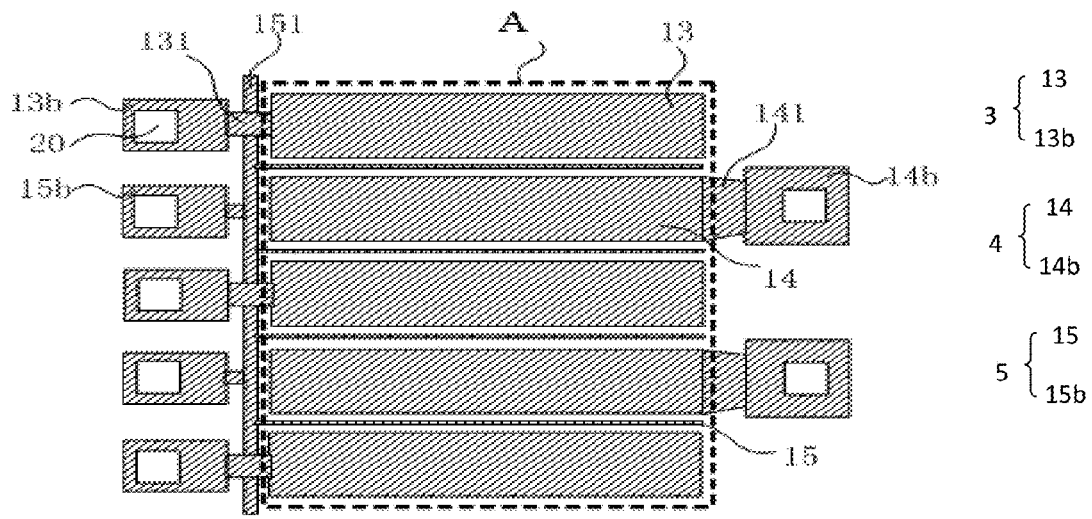
FIG. 2 shows a schematic top view of the semiconductor device according to the first embodiment.

FIG. 1 shows a schematic cross-sectional view of a semiconductor device according to a first embodiment, and FIG. 2 shows a schematic top view of the semiconductor device according to the first embodiment. Hereinafter the first embodiment of the present invention will be described with reference to FIGS. 1 and 2.

Referring to FIGS. 1 and 2, a semiconductor device according to a first embodiment of the present invention comprises: a substrate 11; a multilayer semiconductor layer 2 which is located on the substrate 11; and a source 3, a drain 4 and a gate 5 on the multilayer semiconductor layer. Here, the multilayer semiconductor layer include an active region A and a passive region outside the active region A. The source includes a first source portion 13 located inside the active region A and a second source portion 13b located inside the passive region. The drain includes a first drain portion 14 located inside the active region A and a second drain portion 14b located inside the passive region. The gate includes a first gate portion 15 located inside the active region A and a second gate portion 15b located inside the passive region, and the first gate portion 15 is in a form of interdigitated fingers among the first source portion 13 and the first drain portion 14.

In addition, the semiconductor device further comprises a heat dissipating layer located at one or more of the first gate portion 15, the first source portion 13, the first drain portion 14, the second gate portion 15b, the second source portion 13b and the second drain portion 14b. For example, referring to FIG. 1, in the first embodiment of the present invention, the heat dissipating layer comprises a first heat dissipating layer 17 located on the first gate portion 15 inside the active region A and a second heat dissipating layer 16 located on the first source portion 13 and the first drain portion 14 which are inside the active region and/or the second gate portion 15b, the second source portion 13b and the second drain portion 14b which are inside the passive region. Although in the first embodiment of the present invention both of the first heat dissipating layer 17 and the second heat dissipating layer 16 are provided, those skilled in the art readily appreciate that only one of the first heat dissipating layer 17 and the second heat dissipating layer 16 may be provided in other embodiments.

The substrate 11 may be made of any material which is suitable for GaN to grow, such as Sapphire, SiC, GaN or Si, etc. The substrate 11 may be made by using any suitable deposition method, such as Chemical Vapor Deposition (CVD) method, Vapor Phase Epitaxy (VPE) method, Metal-organic Chemical Vapor Deposition (MOCVD) method, Low Pressure Chemical Vapor Deposition (LPCVD) method, Plasma Enhanced Chemical Vapor Deposition (PECVD) method, Pulsed Laser Deposition (PLD) method, atomic layer epitaxy method, Molecular Beam Epitaxy (MBE) method, sputtering method or evaporation method or the like.

The multilayer semiconductor layer may be made of III-V group compound semiconductor material. The multilayer semiconductor layer may include a nucleation layer 21 located on the substrate 11, a buffer layer 22 located on the nucleation layer 21, and a barrier layer 23 located on the buffer layer 22. The barrier layer 23 and the buffer layer 22 form heterojunction structure. 2DEG (shown in dashed line in FIG. 1) is formed at an interface of the heterojunction. The barrier layer 23 may be made of any semiconductor material which is capable of forming heterojunction with the buffer layer 22, such as gallium-based compound semiconductor material or III group nitride semiconductor material, e.g. $In_xAl_yGa_zN_{1-x-y-z}$ ($0 \leq x, y, z \leq 1$).

The multilayer semiconductor layer may further include a capping layer 24 on the barrier layer 23. All of the first gate portion 15, the first source portion 13 and the first drain portion 14 which are inside the active region A, and the second gate portion 15b, the second source portion 13b and the second drain portion 14b which are inside the passive region are located on the capping layer 24.

The semiconductor device may further comprise a first dielectric layer 25 which is located on the capping layer 24 between the first source portion 13 and the first gate portion 15, between the first drain portion 14 and the first gate portion 15, between the second source portion 13b and the second drain portion 14b as well as between the second drain portion 14b and the second gate portion 15b. The first dielectric layer 25 can passivate a surface of the semiconductor device, reduce or eliminate current collapse effect of the GaN semiconductor device, such as current collapse effect of GaN high electron mobility transistors in the device, as well as prevent the surface of the semiconductor device from external impact. The first dielectric material 25 is typically made of SiN. And the first dielectric layer 25 may be formed with various ways, such as any one of MOCVD, PECVD, ALD, MBE, thermal growth and electron-beam evaporation, and the like.

The first source portion 13 and the first drain portion 14 form ohmic contacts with the multilayer semiconductor layer respectively. The first source portion 13 and the first drain portion 14 may be made of a metal material or a composite material including various metal materials. The second source portion 13b inside the passive region may be coupled to the first source portion 13 inside the active region A via an air bridge 131. The second drain portion 14b inside the passive region may be coupled to the first drain portion 14 inside the active region A via a drain interconnection metal 141.

The second gate portion 15b inside the passive region is coupled to the first gate portion 15 inside the active region A via a gate interconnection wire 151. The air bridge 131 is located above and cross the gate interconnection line 151. The first gate portion 15 may be made of a single layer of metal or a stacked structure of two layers of metal or multiple layers of metal, e.g., a MIS structure in which a layer of insulation dielectric such as $SiO_2$ is disposed between the first gate portion 15 and the multilayer semiconductor layer. The first gate portion 15 may have a T shape or a rectangular shape. In FIG. 1, the first gate portion 15 is shown as having a T shape whose gate cap is located on the multilayer semiconductor layer.

The first heat dissipating layer 17 and the second heat dissipating layer 16 may be made of any material selected from the group consisting of single layer graphene, bilayer graphene, multilayer graphene, graphene nanosheets, single-walled carbon nanotube and multi-walled carbon nanotube or combination thereof. Here, graphene is preferred since it is a new single atomic layer two-dimensional material. A single layer of graphene has a thickness of only 3.4 Å. Due to its unique crystal structure, graphene has excellent physical and chemical properties, such as high conductivity, high current carrying density, excellent thermal conductivity and excellent chemical stability. Graphene has a very good thermal conductivity, and the thermal conductivity of graphene is up to 5000 W/mK which is much higher than that of Au (317 W/mK), Cu (401 W/mK) and Al (237 W/mK) and even higher than that of diamond (2000 W/mK) and carbon nanotubes (3000 W/mK), etc. Thus graphene is one of the materials having best thermal conductivity. In addition, graphene has high electrical conductivity, and does not increase the resistance of the circuit. Therefore graphene material is very suitable to be used in heat dissipating layers in semiconductor devices.

The second heat dissipating layer 16 may be disposed on the air bridge 131 and the drain interconnection metal 141 also. The second heat dissipating layer 16 disposed on the air bridge 131 and the drain interconnection metal 141 may be formed in the same process of forming the second heat dissipating layer 16 located on the first source portion 13 and the first drain portion 14 and/or the second gate portion 15b, the second source portion 13b and the second drain portion 14b.

By disposing heat dissipating material on one or more of the first source portion 13, the first drain portion 14, the first gate portion 15, the second source portion 13b, the second drain portion 14b and the second gate portion 15b, transfer of the heat above the metal in the active region A and the passive region is accelerated, the thermal conductivity in the lateral direction is improved. Therefore, the heat dissipating effect of the whole semiconductor device is improved, the temperature inside the semiconductor device is reduced, uniformity of heat flux distribution of the semiconductor device is increased and thus the reliability and performance of the semiconductor device is improved.

Since the gate is made in a process different from that of making the source and the drain, the first heat dissipating layer 17 and the second heat dissipating layer 16 are formed in different processes.

To form the first heat dissipating layer 17 and the second heat dissipating layer 16, firstly, graphene grown on a copper thin film or a nickel thin film, e.g. with CVD method, is transferred onto a surface of the semiconductor device. Then pattern of graphene is defined. Lastly, graphene is etched with oxygen plasma on places where it is not needed. Alternatively, graphene is dissolved in suspension, and is spin-coated on one or more of the first source portion 13, the first drain portion 14, the first gate portion 15, the second source portion 13b, the second drain portion 14b and the second gate portion 15b with the spin coating method. In the latter case, etching of graphene is not required.

The semiconductor device may further include a second dielectric layer 18 and a third dielectric layer 19. The second dielectric layer 18 is located on the first heat dissipating layer 17 as well as the first dielectric layer 25 between the first source portion 13 and the first drain portion 14. The second dielectric layer 18 is disposed near the gate, and serves to improve the passivation effect, reduce current collapse effect, thereby improving characteristics of the semiconductor device.

Since the second dielectric layer 18 is located on the first heat dissipating layer 17, a method of forming the second dielectric layer 18 should not affect the first heat dissipating layer 17. Because the first heat dissipating layer 17 has a very small thickness, the particle energy cannot be excessive in the process of forming the second dielectric layer 18, otherwise the first heat dissipating layer 17 will be etched. The second dielectric layer 18 may be formed using any of ALD method, electron beam evaporation method and MBE method.

The third dielectric layer 19 is located on the second heat dissipating layer 16 and the second dielectric layer 18. The third dielectric layer 19 serves to protect the second heat dissipating layer 16 to avoid a reliability issue due to the second heat dissipating layer 16 falling off into the semiconductor device. Since the third dielectric layer 19 is located on the second heat dissipating layer 16, a method of forming the third dielectric layer 19 may be the same as that of forming the second dielectric layer 18.

A window 20 may be formed in the second heat dissipating layer 16 and the third dielectric layer 19 inside the passive region through patterning. The patterning may be made by using lithography technology and etching technology. The window 20 enables coupling of the second source portion 13, the second drain portion 14 and the second gate portion 15 inside the passive region with other components in the semiconductor device.

Since single layer graphene, bilayer graphene, multilayer graphene, graphene nanosheets, single-walled carbon nanotube and multi-walled carbon nanotube have high conductivity, high current density endurance and high electromigration resistance, when some problems such as electromigration, empty or disconnection appear in the wires and the second source portion 13b, the second drain portion 14b and the second gate portion 15b, single layer graphene, bilayer graphene, multilayer graphene, graphene nanosheets, single-walled carbon nanotube and multi-walled carbon nanotube can replace metal to make current flowing through, thereby further improving reliability of the semiconductor device.

According to this embodiment, by disposing the first heat dissipating layer 17 on the first gate portion 15 inside the active region A and disposing the second heat dissipating layer 16 on the first source portion 13 and the first drain portion 14 inside the active region A and/or the second source portion 13b, the second drain portion 14b and the second gate portion 15b inside the passive region, the thermal conductivity in the lateral direction is improved. Therefore, the heat dissipating effect of the whole semiconductor device is improved, the temperature inside the semiconductor device is reduced, uniformity of heat flux distribution of the semiconductor device is increased and thus the reliability and performance of the semiconductor device is improved. Furthermore, by disposing the second dielectric layer 18 on the first heat dissipating layer 17 as well as the first dielectric layer 25 between the first source portion 13 and the first drain portion 14, current collapse effect is reduced, thereby improving characteristics of the semiconductor device. By disposing the third dielectric 19 on the second heat dissipating layer 16 and the second dielectric layer 18, the second heat dissipating layer 16 is avoided from falling off into the semiconductor device, so that reliability and performance of the semiconductor device is improved.

Figure 3:
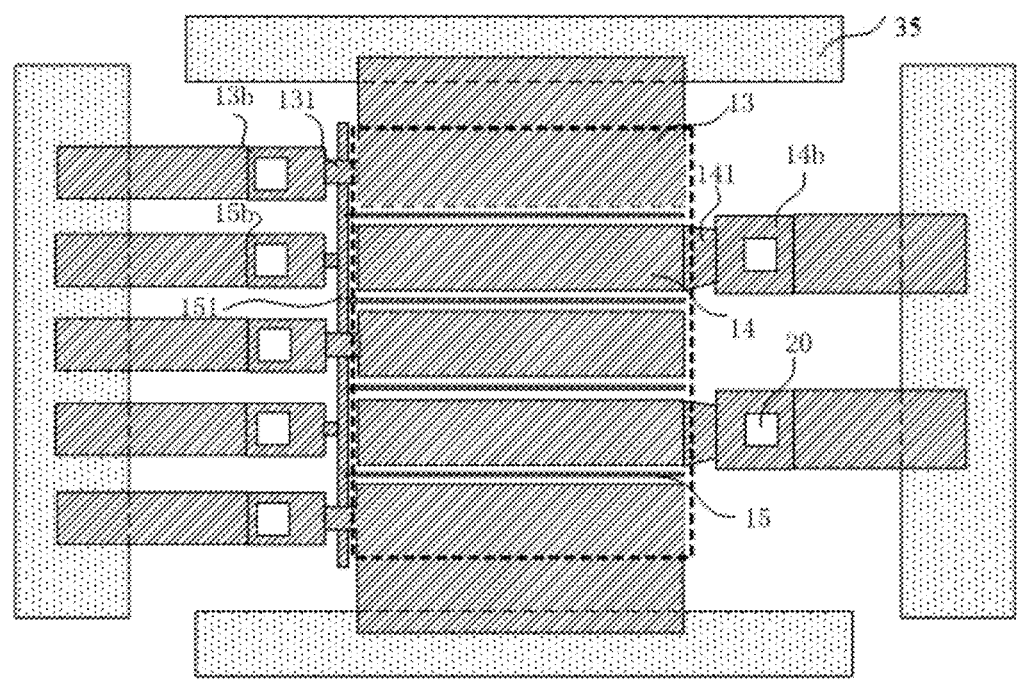
FIG. 3 shows a schematic top view of a semiconductor device according to a second embodiment.
Figure 4:
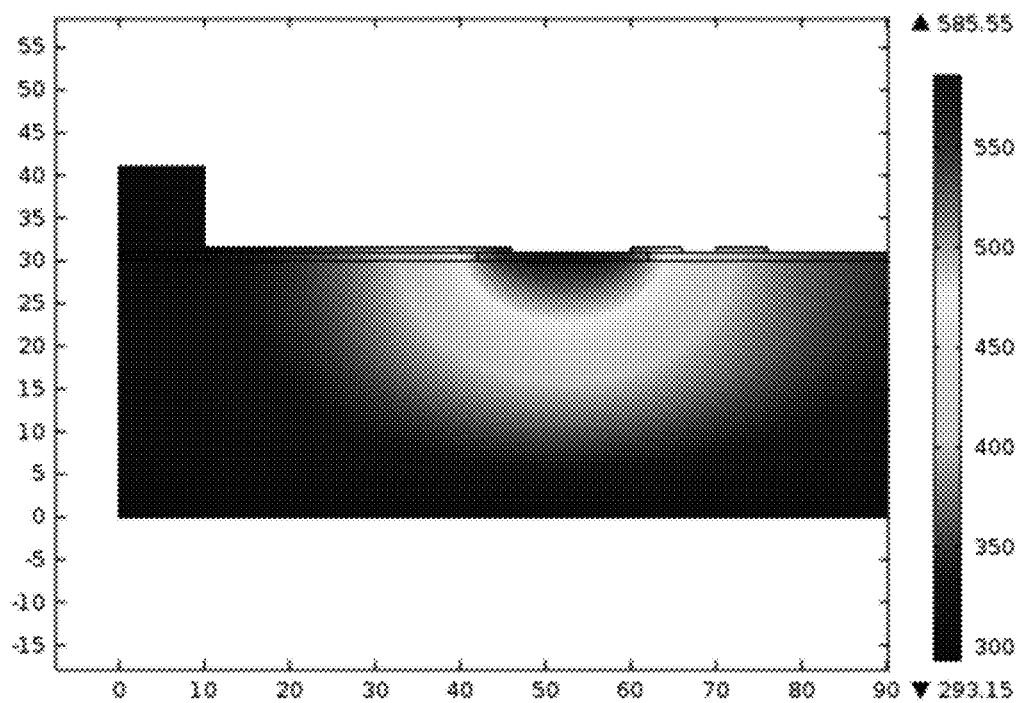
FIG. 4 shows a schematic cross-sectional temperature view of a semiconductor device according to the prior art.
Figure 5:
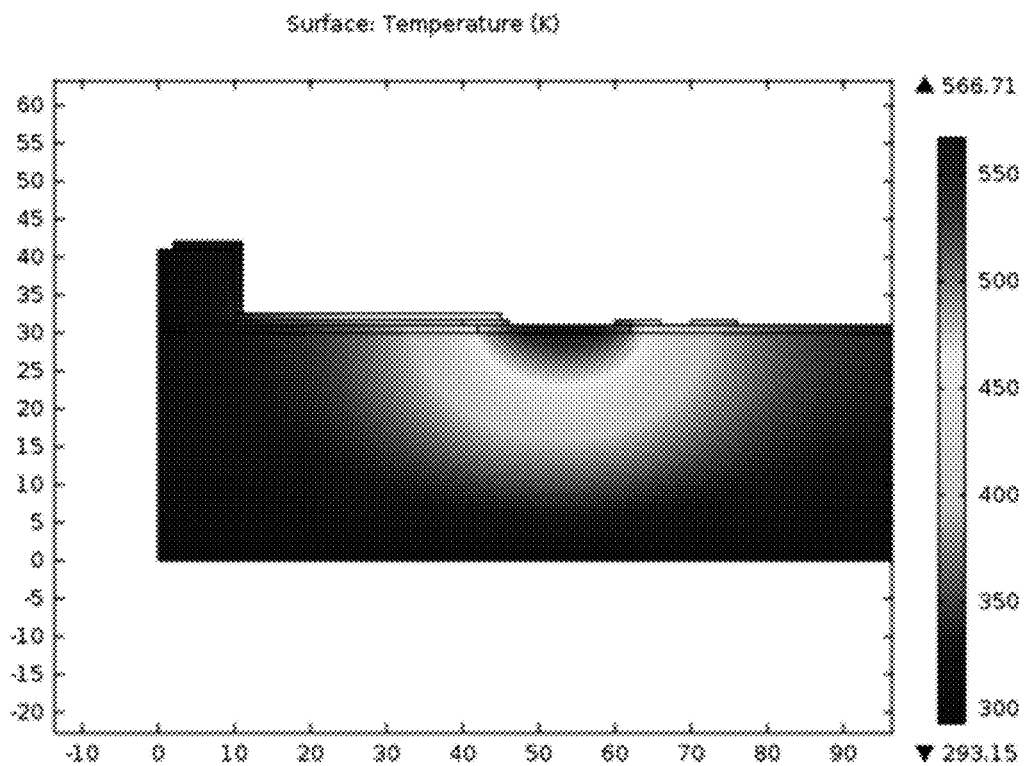
FIG. 5 shows a schematic cross-sectional temperature view of the semiconductor device according to the second embodiment.

FIG. 3 shows a schematic top view of a semiconductor device according to a second embodiment, FIG. 4 shows a schematic cross-sectional temperature view of a semiconductor device according to the prior art, and FIG. 5 shows a schematic cross-sectional temperature view of the semiconductor device according to the second embodiment. Hereinafter the second embodiment of the present invention will be described with reference to FIGS. 3 to 5.

The second embodiment is substantially the same as the first embodiment except for a heat sink, and description of the same components will be omitted for avoidance of redundancy.

Compared with the first embodiment, referring to FIG. 3, a semiconductor device according to the second embodiment of the present invention further comprises a heat sink 35. The heat sink 35 is disposed at edges of the passive region, for example surrounding the four edges of the passive region, and is coupled to the second heat dissipating layer 16. That is, the second heat dissipating layer 16 which is located at the outmost portion of the active region A and inside the passive region extends to a position above the heat sink 35 and is coupled to the heat sink 35, thereby further reducing the temperature inside the semiconductor device.

In order to avoid a short circuit between the electrodes, the heat sink 35 may be made of insulating material, such as ceramic.

FIGS. 4 and 5 respectively show a schematic cross-sectional temperature view of a semiconductor device according to the prior art and that according to the second embodiment, which are simulated using Comsol software. Here, in the case shown in FIG. 5, a graphene heat dissipating layer is disposed on the first drain portion 14 inside the active region A and the second drain portion 14b inside the passive region, and extends to and is coupled to the insulating heat sink 35 located near the second drain portion 14b. It can be seen from FIGS. 4 and 5 that the highest temperature of the semiconductor device according to the second embodiment of the present invention is reduced 18.84K compared to the prior art.

According to this embodiment, by disposing the insulting heat sink 35 around the passive region and extending the second heat dissipating layer 16 to a position above the insulting heat sink 35, the temperature inside the semiconductor device is further reduced.

Figure 6:
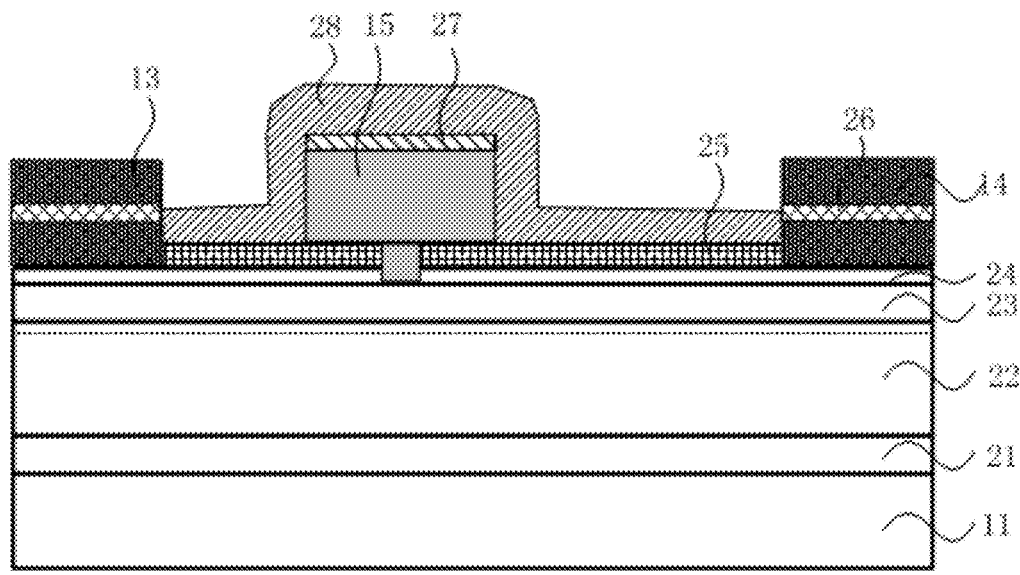
FIG. 6 shows a schematic cross-sectional view of an active region of a semiconductor device according to a third embodiment.

FIG. 6 shows a schematic cross-sectional view of an active region of a semiconductor device according to a third embodiment. Referring to FIG. 6, a semiconductor device according to the third embodiment of the present invention comprises: a substrate 11; a multilayer semiconductor layer which is located on the substrate 11; and a source, a drain and a gate on the multilayer semiconductor layer. Here, the multilayer semiconductor layer includes an active region and a passive region (not shown in FIG. 6) outside the active region. The source includes a first source portion 13 located inside the active region and a second source portion (not shown in FIG. 6) located inside the passive region. The drain includes a first drain portion 14 located inside the active region and a second drain portion (not shown in FIG. 6) located inside the passive region. The gate includes a first gate portion 15 located inside the active region and a second gate portion (not shown in FIG. 6) located inside the passive region, and the first gate portion 15 is in a form of interdigital among the first source portion 13 and the first drain portion 14.

In addition, a heat dissipating layer is further disposed, comprising a third heat dissipating layer 27 located on the first gate portion 15 inside the active region and a fourth heat dissipating layer 26 located in one or more of the first source portion 13, the first drain portion 14, the second gate portion, the second source portion and the second drain portion. Although in the third embodiment of the present invention both of the third heat dissipating layer 27 and the fourth heat dissipating layer 26 are provided, those skilled in the art readily appreciate that only one of the third heat dissipating layer 27 and the fourth heat dissipating layer 26 may be provided in other embodiments.

Here, "in" refers to "being an intermediate layer" in the height direction. For example, the first source portion 13 may have a multi-layer structure and the fourth heat dissipating layer 26 may be disposed in the multilayer structure as an intermediate layer.

The substrate 11 and the multilayer semiconductor layer in the semiconductor device according to the third embodiment are the same or substantially same as those in the semiconductor device according to the first embodiment, and repeated description thereof will be omitted herein.

In this embodiment, the second source portion inside the passive region is coupled to the first source portion 13 inside the active region via an air bridge (not shown in FIG. 6). The second drain portion inside the passive region is coupled to the first drain portion 14 inside the active region via a drain interconnection metal (not shown in FIG. 6). The second gate portion inside the passive region is coupled to the first gate portion 15 inside the active region via a gate interconnection wire (not shown in FIG. 6). The air bridge is located above and cross the gate interconnection wire.

The method for forming the fourth heat dissipating layer 26 according to the third embodiment is the same or substantially same as that for forming the second heat dissipating layer 16 according to the first embodiment, and repeated description thereof will be omitted herein.

In this embodiment, the third heat dissipating layer 27 is made of any material selected from the group consisting of single layer graphene, bilayer graphene, multilayer graphene, graphene nanosheets, single-walled carbon nanotube and multi-walled carbon nanotube or combination thereof. The fourth heat dissipating layer 26 is made of any material selected from the group consisting of single layer graphene, bilayer graphene, multilayer graphene, graphene nanosheets, single-walled carbon nanotube and multi-walled carbon nanotube or combination thereof, and preferably made of graphene. Since graphene has high conductivity, there is no extra parasitic resistance between the source and the drain. In a direction in which the graphene is titled, the heat is transferred efficiently, thereby accelerating lateral heat dissipation of the device. In addition, since the fourth heat dissipating layer 26 is disposed in, rather than on, one or more of the first source portion 13, the first drain portion 14, the second gate portion, the second source portion and the second drain portion, the fourth heat dissipating layer 26 is closer to the surface of the semiconductor device and closer to the region in which the temperature is highest compared with the first embodiment, so that the heat dissipation effect is further improved.

By disposing heat dissipating material on the first gate portion 15 and/or in one or more of the first source portion 13, the first drain portion 14, the second source portion 13b, the second drain portion 14b and the second gate portion 15b, transfer of the heat above the metal in the active region and the passive region is accelerated, the thermal conductivity in the lateral direction is improved. Therefore, the heat dissipating effect of the whole semiconductor device is improved, the temperature inside the semiconductor device is reduced, uniformity of heat flux distribution of the semiconductor device is increased and thus the reliability and performance of the semiconductor device is improved.

The semiconductor device according to the third embodiment may further include a fourth dielectric layer 28. The fourth dielectric layer 28 is located on the third heat dissipating layer 27 and on the first dielectric layer 25 between the first source portion 13 and the first gate portion 15, between the first drain portion 14 and the first gate portion 15, between the second source portion and the second gate portion as well as between the second drain portion and the second gate portion. Since the fourth dielectric layer 28 is disposed near the first gate portion 15, the passivation effect can be improved and the current collapse effect can be decreased, thereby improving characteristics of the semiconductor device. In addition, the fourth dielectric layer 28 can protect the third heat dissipating layer 27 to avoid a reliability issue due to the third heat dissipating layer 27 falling off into the semiconductor device. Since the fourth dielectric layer 28 is located on the third heat dissipating layer 27, a method of forming the fourth dielectric layer 28 may be the same as that of forming the second dielectric layer 18 in the first embodiment.

Compared with the first embodiment, the third dielectric layer 19 is not required, thus the process is simplified. In addition, since the material forming the fourth heat dissipating layer 26 and the third heat dissipating layer 27 has high conductivity, there is no extra parasitic resistance among the source, the drain and the gate. In a direction in which the fourth heat dissipating layer 26 and the third heat dissipating layer 27 are titled, the heat is transferred efficiently, thereby accelerating lateral heat dissipation of the device. Furthermore, since the fourth heat dissipating layer 26 is disposed closer to the surface of the semiconductor device and closer to the region in which the temperature is highest, the heat dissipation effect is further improved.

Figure 7:
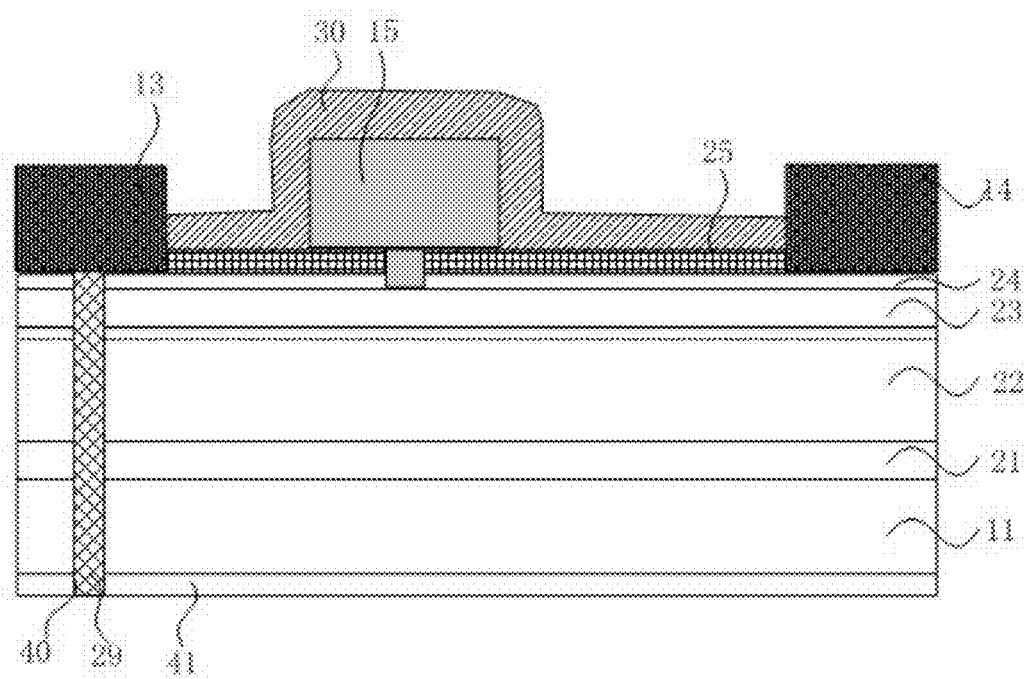
FIG. 7 shows a schematic cross-sectional view of a semiconductor device according to a fourth embodiment in which a backside via is located at a first source portion in an active region.
Figure 8:
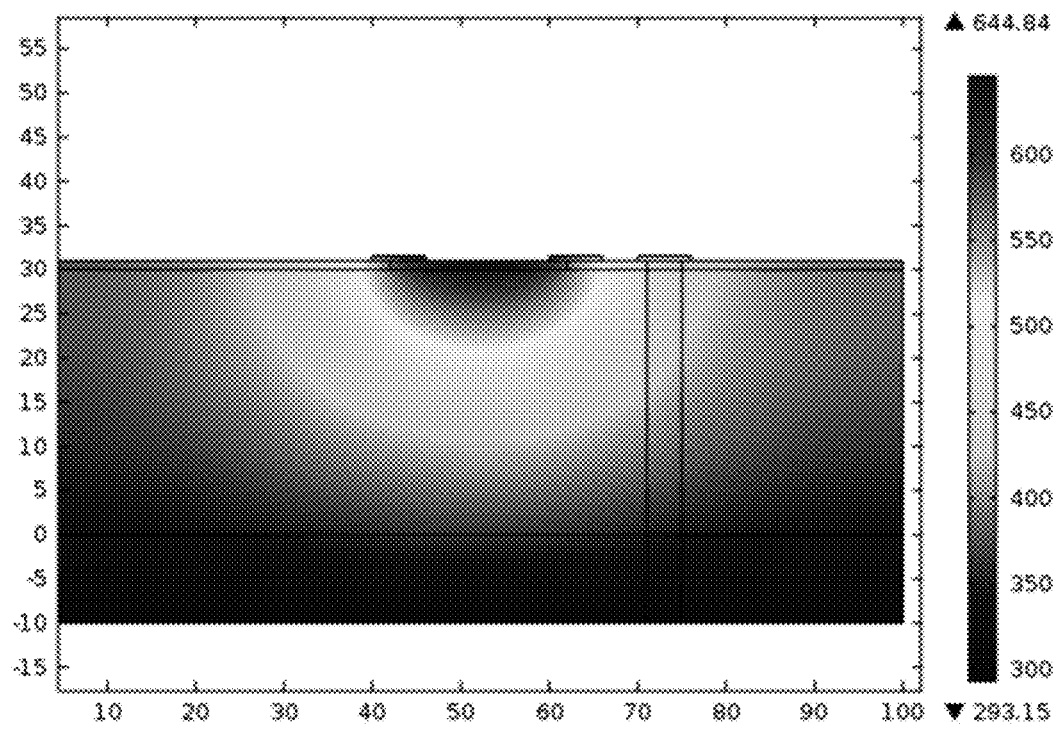
FIG. 8 shows a schematic cross-sectional temperature view of the semiconductor device according to the fourth embodiment in which gold is filled in the backside via.
Figure 9:
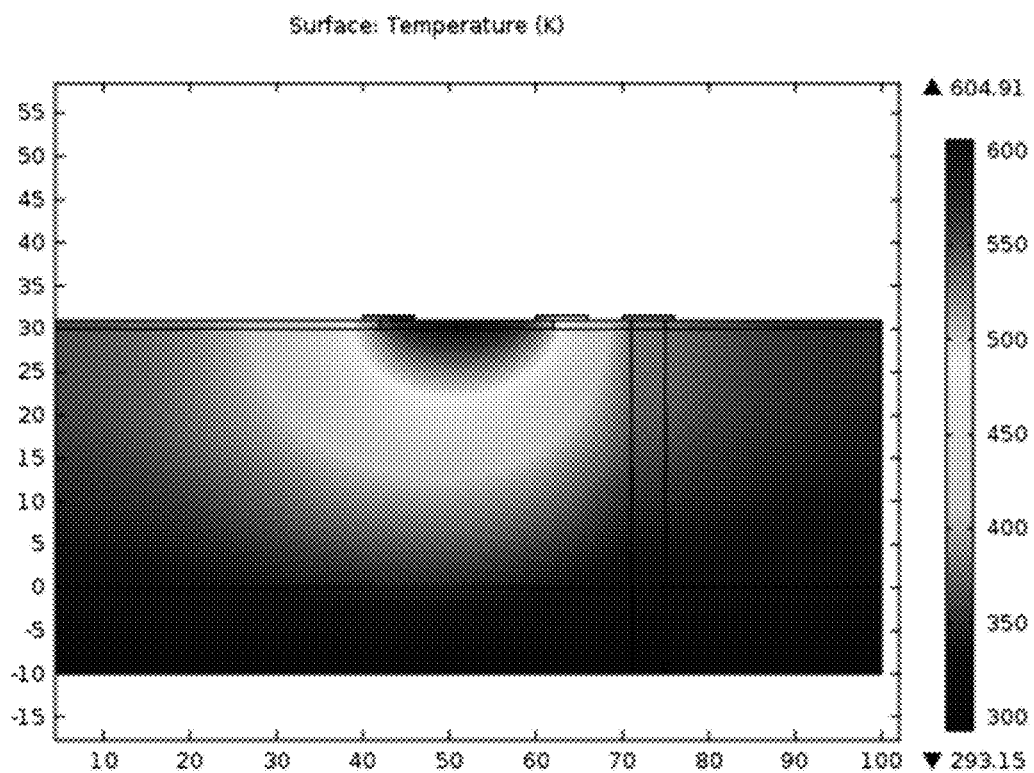
FIG. 9 shows a schematic cross-sectional temperature view of the semiconductor device according to the fourth embodiment in which graphene is filled in the backside via.

FIG. 7 shows a schematic cross-sectional view of a semiconductor device according to a fourth embodiment in which a backside via is located at a first source portion in an active region, FIG. 8 shows a schematic cross-sectional temperature view of the semiconductor device according to the fourth embodiment in which gold is filled in the backside via, and FIG. 9 shows a schematic cross-sectional temperature view of the semiconductor device according to the fourth embodiment in which graphene is filled in the backside via. Hereinafter the fourth embodiment of the present invention will be described with reference to FIGS. 7-9.

Referring to FIG. 7, a semiconductor device according to the fourth embodiment of the present invention comprises: a back metal 41; a substrate 11 on the back metal 41; a multilayer semiconductor layer which is located on the substrate 11; and a source, a drain and a gate on the multilayer semiconductor layer. Here, the multilayer semiconductor layer includes an active region and a passive region outside the active region. The source includes a first source portion 13 located inside the active region and a second source portion (not shown in FIG. 7) located inside the passive region. The second source portion is coupled to the first source portion 13 via an air bridge (not shown in FIG. 7). The drain includes a first drain portion 14 located inside the active region and a second drain portion (not shown in FIG. 7) located inside the passive region. The second drain portion is coupled to the first drain portion 14 via a drain interconnection metal (not shown in FIG. 7). The gate includes a first gate portion 15 located inside the active region and a second gate portion (not shown in FIG. 7) located inside the passive region. The first gate portion 15 is in a form of interdigital among the first source portion 13 and the first drain portion 14. The second gate portion is coupled to the first gate portion 15 via a gate interconnection wire (not shown in FIG. 7). The air bridge is located above and cross the gate interconnection line.

The semiconductor device according to this embodiment comprises a backside via 40 located between the back metal 41 and the first source portion 13 inside the active region. The backside via 40 is formed as penetrating through the substrate 11 and the multilayer semiconductor layer from the back metal 41 to the firth source portion 13, so that the first source portion 13 can be coupled to the back metal 41 via the backside via 40. Alternatively, the backside via 40 can be located between the back metal 41 and the second source portion. That is, the backside via 40 is formed as penetrating through the substrate 11 and the multilayer semiconductor layer from the back metal 41 to the second source portion inside the passive region, so that the second source portion can be coupled to the back metal 41 via the backside via 40. A fifth heat dissipating layer 29 may be disposed in the backside via 40.

The back metal 41 may be made of gold. The fifth heat dissipating layer 20 may be made of any material selected from the group consisting of single layer graphene, bilayer graphene, multilayer graphene, graphene nanosheets, single-walled carbon nanotube and multi-walled carbon nanotube or combination thereof. Since the graphene and carbon nanotubes have excellent electrical conductivity and thermal conductivity, the internal temperature of the semiconductor device can be reduced effectively without additional addition of parasitic resistance.

Preferably, the semiconductor device further comprises a fifth dielectric layer 30. The fifth dielectric layer 30 is located on the first dielectric layer 25 which covers the first gate portion 15 and is located between the first gate portion 15 and the first source portion 13 and between the first gate portion 15 and the first drain portion 14, and also covers the second gate portion and is located between the second gate portion and the second source portion and between the second gate portion and the second drain portion. The fifth dielectric layer 30 is disposed near the gate, and serves to improve the passivation effect, reduce current collapse effect, thereby improving characteristics of the semiconductor device.

In this embodiment, the cross-sectional shape of the backside via 40 may be a regular shape such as a round shape or an oval shape, or an irregular shape.

FIGS. 8 and 9 respectively show a schematic cross-sectional temperature view of a semiconductor device according to the fourth embodiment in which the filling material is gold and graphene respectively, which are simulated using Comsol software. It can be seen from FIGS. 8 and 9 that the highest temperature of the semiconductor device according to the fourth embodiment of the present invention in which the filling material is graphene is reduced 40K compared to the case in which the filling material is gold.

According to this embodiment, by disposing a backside via 40 below the first source portion 13 or the second source portion and disposing a heat dissipating layer 29 which is made of a material having excellent electricity conductivity and thermal conductivity in the backside via 40, the internal temperature of the semiconductor device can be reduced effectively without additional addition of parasitic resistance.

Figure 10:
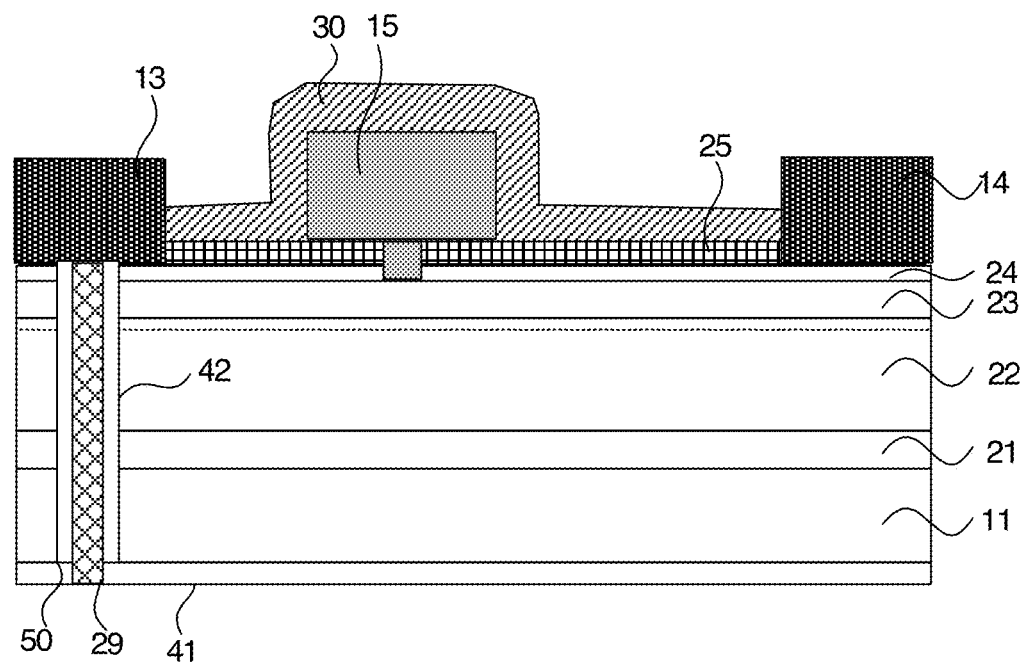
FIG. 10 shows a schematic cross-sectional view of a semiconductor device according to a fifth embodiment in which a backside via is located at a first source portion in an active region.

FIG. 10 shows a schematic cross-sectional view of a semiconductor device according to a fifth embodiment in which a backside via is located at a first source portion in an active region. Except for the structure of the backside via, the semiconductor device according to the fifth embodiment is the same or substantially same as that according to the fourth embodiment, and repeated description of the same components will be omitted herein.

Referring to FIG. 10, a metal layer 42 is disposed on an inner face of the backside via 50. The metal layer 42 may be made of the same material and be formed with the same process as the back metal 41. Further, the metal layer 42 is connected to the back metal 41 at an end of the backside via 40 near the back metal 41, that is, the metal layer 42 and the back metal 41 may be formed integrally. The fifth heat dissipating layer 29 is disposed on the metal layer 42, that is, is disposed on the metal layer 42 on the inner surface of the backside via 50 in a direction perpendicular to the axis of the backside via 50.

The fifth heat dissipating layer 29 is made of any material selected from the group consisting of single layer graphene, bilayer graphene, multilayer graphene, graphene nanosheets, single-walled carbon nanotube and multi-walled carbon nanotube or combination thereof.

It should be understood that this invention can be applied to various semiconductor devices to reduce the heat dissipating effect thereof, including but not limited to, high power GaN High Electron Mobility Transistors (HEMTs) under high voltage and high current, transistors having a Silicon-On-Insulator (SOI) structure, gallium arsenide (GaA) based transistors and Metal-Oxide-Semiconductor Field-Effect Transistors (MOSFETs), Metal-Semiconductor Field-Effect Transistors (MISFETs), Double Heterojunction Field-Effect Transistors (DHFETs), Junction Field-Effect Transistors (JFETs), Metal-Semiconductor Field-Effect Transistors (MESFETs), Metal-Semiconductor Heterojunction Field-Effect Transistors (MISHFETs).

It should be understood that the embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the FIG.s, it will be understood by those of ordinary skill in the art that various changes in form and details may be made therein without departing from the spirit and scope of the present invention as defined by the following claims and their equivalents.

What is claimed is:

1. A semiconductor device, comprising:
a substrate;
a multilayer semiconductor layer located on the substrate, the multilayer semiconductor layer including an active region and a passive region located outside the active region;
a source located on the multilayer semiconductor layer, the source including a first source portion inside the active region and a second source portion inside the passive region;
a drain located on the multilayer semiconductor layer, the drain including a first drain portion inside the active region and a second drain region inside the passive region;
a gate located on the multilayer semiconductor layer, the gate including a first gate portion inside the active region and a second gate portion inside the passive region, and the first gate portion being in a form of interdigitated fingers among the first source portion and the first drain portion; and
a first heat dissipating layer disposed on the first gate portion and a second heat dissipating layer disposed on one or more of the first source portion, the first drain portion, the second source portion, the second drain portion and the second gate portion.

2. The semiconductor device of claim 1, further comprising:
a first dielectric layer disposed on the multilayer semiconductor layer between the first source portion and the first gate portion and between the first drain portion and the first gate portion; and
a second dielectric layer disposed on the first heat dissipating layer and on the first dielectric layer between the first source portion and the first gate portion and between the first drain portion and the first gate portion.

3. The semiconductor device of claim 2, further comprising a third dielectric layer disposed on the second heat dissipating layer and the second dielectric layer.

4. The semiconductor device of claim 1, wherein the second source portion is coupled to the first source portion via an air bridge, the second heat dissipating layer is further disposed on the air bridge.

5. The semiconductor device of claim 1, wherein the second drain portion is coupled to the first drain portion via a drain interconnection metal, the second heat dissipating layer is further disposed on the drain interconnection metal.

6. The semiconductor device of claim 1, further comprising a heat sink which is connected to the second heat dissipating layer.

7. The semiconductor device of claim 6, wherein the heat sink is made of ceramic.

8. A semiconductor device, comprising:
a substrate;
a multilayer semiconductor layer located on the substrate, the multilayer semiconductor layer including an active region and a passive region located outside the active region;
a source located on the multilayer semiconductor layer, the source including a first source portion inside the active region and a second source portion inside the passive region;
a drain located on the multilayer semiconductor layer, the drain including a first drain portion inside the active region and a second drain region inside the passive region;
a gate located on the multilayer semiconductor layer, the gate including a first gate portion inside the active region and a second gate portion inside the passive region, and the first gate portion being in a form of interdigitated fingers among the first source portion and the first drain portion; and
a third heat dissipating layer disposed on the first gate portion and a fourth heat dissipating layer disposed in one or more of the first source portion, the first drain portion, the second source portion, the second drain portion and the second gate portion.

9. The semiconductor device of claim 8, further comprising:
a first dielectric layer disposed on the multilayer semiconductor layer between the first source portion and the first gate portion, between the first drain portion and the first gate portion, between the second source portion and the second gate portion and between the second drain portion and the second gate portion; and
a fourth dielectric layer disposed on the third heat dissipating layer and on the first dielectric layer between the first source portion and the first gate portion, between the first drain portion and the first gate portion, between the second source portion and the second gate portion and between the second drain portion and the second gate portion.

10. A semiconductor device, comprising:
a substrate;
a multilayer semiconductor layer located on the substrate, the multilayer semiconductor layer including an active region and a passive region located outside the active region;
a source located on the multilayer semiconductor layer, the source including a first source portion inside the active region and a second source portion inside the passive region;
a drain located on the multilayer semiconductor layer, the drain including a first drain portion inside the active region and a second drain region inside the passive region;
a gate located on the multilayer semiconductor layer, the gate including a first gate portion inside the active region and a second gate portion inside the passive region, and the first gate portion being in a form of interdigitated fingers among the first source portion and the first drain portion;
a back metal located on a surface of the substrate opposite to the multilayer semiconductor layer;
a backside via below one of the first source portion and the second source portion, the backside via penetrating through the multilayer semiconductor layer and the substrate and being coupled to the back metal; and
a fifth heat dissipating layer disposed in the backside via.

11. The semiconductor device of claim 10, further comprising:
a first dielectric layer disposed on the multilayer semiconductor layer between the first source portion and the first gate portion, between the first drain portion and the first gate portion, between the second source portion and the second gate portion and between the second drain portion and the second gate portion; and
a fifth dielectric layer disposed on the first gate portion and on the first dielectric layer between the first source portion and the first gate portion, between the first drain portion and the first gate portion, between the second source portion and the second gate portion and between the second drain portion and the second gate portion.

12. The semiconductor device of claim 10, further comprising a metal layer disposed on an inner surface of the backside via and the fifth heat dissipating layer is disposed on the metal layer.

13. The semiconductor device of claim 12, wherein the metal layer is made of the same material as that of the back metal.

14. The semiconductor device of claim 12, wherein the metal layer is connected to the back metal at an end of the backside via near the back metal.

15. The semiconductor device of claim 10, wherein the backside via has a cross-sectional shape of a circle or an oval.

16. The semiconductor device of claim 1, wherein the first heat dissipating layer and the second dissipating layer are made of a material selected from the group consisting of single layer graphene, bilayer graphene, multilayer graphene, graphene nanosheets, single-walled carbon nanotube and multi-walled carbon nanotube or combination thereof.

17. The semiconductor device of claim 1, wherein the multilayer semiconductor layer comprises:
a nucleation layer located on the substrate;
a buffer layer located on the nucleation layer;
a barrier layer located on the buffer layer; and
a capping layer located on the barrier layer,
wherein the first source portion, the first drain portion, the first gate portion, the second source portion, the second drain portion and the second gate portion are located on the capping layer.

18. The semiconductor device of claim 8, wherein the third heat dissipating layer and the fourth dissipating layer are made of a material selected from the group consisting of single layer graphene, bilayer graphene, multilayer graphene, graphene nanosheets, single-walled carbon nanotube and multi-walled carbon nanotube or combination thereof.

19. The semiconductor device of claim 8, wherein the multilayer semiconductor layer comprises:
a nucleation layer located on the substrate;
a buffer layer located on the nucleation layer;
a barrier layer located on the buffer layer; and
a capping layer located on the barrier layer,
wherein the first source portion, the first drain portion, the first gate portion, the second source portion, the second drain portion and the second gate portion are located on the capping layer.

20. The semiconductor device of claim 10, wherein the fifth heat dissipating layer is made of a material selected from the group consisting of single layer graphene, bilayer graphene, multilayer graphene, graphene nanosheets, single-walled carbon nanotube and multi-walled carbon nanotube or combination thereof.

* * * * *